US008618664B2

(12) United States Patent
Lin

(10) Patent No.: US 8,618,664 B2
(45) Date of Patent: Dec. 31, 2013

(54) SEMICONDUCTOR PACKAGE AND METHOD FOR PACKAGING THE SAME

(75) Inventor: Sheng Wei Lin, Fongshan (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 438 days.

(21) Appl. No.: 12/729,693

(22) Filed: Mar. 23, 2010

(65) Prior Publication Data

US 2011/0049691 A1    Mar. 3, 2011

(30) Foreign Application Priority Data

Aug. 25, 2009   (TW) .............................. 98128481 A

(51) Int. Cl.
H01L 23/495 (2006.01)
H01L 23/48 (2006.01)
H01L 23/52 (2006.01)
H01L 23/12 (2006.01)
H01L 29/40 (2006.01)

(52) U.S. Cl.
USPC ........... 257/773; 257/676; 257/692; 438/123; 438/124

(58) Field of Classification Search
None
See application file for complete search history.

(56) References Cited

U.S. PATENT DOCUMENTS

| 2005/0173791 A1 | 8/2005 | Hsu et al. |
| 2008/0014436 A1 | 1/2008 | Nickerson et al. |
| 2008/0185726 A1* | 8/2008 | Wang et al. .................. 257/773 |
| 2009/0072416 A1 | 3/2009 | Sano |

* cited by examiner

Primary Examiner — Fernando L Toledo
Assistant Examiner — Valerie N Newton

(57) ABSTRACT

A semiconductor package includes a chip, a carrier, a bonding wire and a molding compound. The chip includes a pad. The carrier includes a finger and has an upper surface and a lower surface opposite to the upper surface, wherein the upper surface supports the chip. The bonding wire is extended from the finger to the pad for electrically connecting the chip to the carrier, wherein the bonding wire defines a projection portion on the upper surface of the carrier, a straight line is defined to pass through the finger and pad, there is a predetermined angle between the tangent line of the projection portion at the finger and the straight line. The molding compound seals the chip and the bonding wire, and covers the carrier.

15 Claims, 14 Drawing Sheets

SEMICONDUCTOR PACKAGE AND METHOD FOR PACKAGING THE SAME

CROSS REFERENCE TO RELATED APPLICATION

This application claims the priority benefit of Taiwan Patent Application Serial Number 098128481, filed on Aug. 25, 2009, the full disclosure of which is incorporated herein by reference.

TECHNICAL FIELD

The invention is related to a method for packaging a semiconductor package, and more particularly to a wire bonding structure of a semiconductor package, wherein there is no short circuit between adjacent two of bonding wires.

BACKGROUND

Referring to FIG. 1, according to a process for manufacturing a semiconductor package, a wire bonding process is widely applied to form an electrical connection between a pad 32 of a chip 10 and a finger 34 of a substrate 12 by using a bonding wire 20. Such a wire bonding process is mainly based on gold (Au) wires, but copper (Cu) wires have an advantage of low cost.

Referring to FIGS. 2 to 6, they depict a conventional forward wire bonding process. Referring to FIG. 2, a bonding wire 20 is provided by a capillary 18 of a wire bonding machine 16. One end 23 of the bonding wire 20 is bonded to a pad 32 of a chip 10 so as to form a first bond 21. Referring to FIG. 3, the capillary 18 is upward moved to a predetermined height. Referring to FIG. 4, the bonding wire 20 is curved by the capillary 18. The necessary length of the bonding wire 20 is automatically provided by the wire bonding machine 16. Referring to FIG. 5, the other end 25 of the bonding wire 20 is bonded to a finger 34 of a substrate 12 so as to form a second bond 26. Referring to FIG. 6, the rest part 20' of the bonding wire 20 is separated from the second bond 26 so as to form the conventional wire bonding structure.

Referring to FIGS. 7 to 11, they depict a conventional reverse wire bonding process. Referring to FIG. 7, a bonding wire 20 is provided by a capillary 18 of a wire bonding machine 16. One end 23 of the bonding wire 20 is bonded to a finger 34 of a substrate 12 so as to form a first bond 21. Referring to FIG. 8, the capillary 18 is upward moved to a predetermined height. Referring to FIG. 9, the bonding wire 20 is curved by the capillary 18. The necessary length of the bonding wire 20 is automatically provided by the wire bonding machine 16. Referring to FIG. 10, the other end 25 of the bonding wire 20 is bonded to a pad 32 of a chip 10 so as form a second bond 26. Referring to FIG. 11, the rest part 20' of the bonding wire 20 is separated from the second bond 26 so as to form the conventional wire bonding structure.

Referring to FIG. 12, it depicts a plan schematic view of the conventional forward or reverse wire bonding structure. There are a lot of bonding wires 20, which are tightly arranged in order, and the projection portion of the bonding wire 20 on the substrate 12 is a straight line. Referring to FIG. 13, according to the conventional forward or reverse wire bonding structure, possibly there is a problem of wire sweep so as to further cause a short circuit between adjacent two of bonding wires because of the shock of a mold flow of a molding compound when the molding compound is subsequently formed.

Accordingly, there exists a need for a wire bonding structure of a semiconductor package capable of solving the above-mentioned problems.

SUMMARY

The present invention provides a semiconductor package including a chip, a carrier, a bonding wire and a molding compound. The chip includes a pad. The carrier includes a finger and has an upper surface and a lower surface opposite to the upper surface, wherein the upper surface supports the chip. The bonding wire is extended from the finger to the pad for electrically connecting the chip to the carrier, wherein the bonding wire defines a projection portion on the upper surface of the carrier, a straight line is defined to pass through the finger and pad, there is a predetermined angle between a tangent line of the projection portion at the finger and the straight line 142a. The molding compound seals the chip and the bonding wire, and covers the carrier.

According to the projection portion of the bonding wire of the present invention on the upper surface of the carrier, the curved direction of the projection portion is opposite to the flow direction of the mold flow of the molding compound, thereby providing a safe margin after wire sweep. Thus, there is still no short circuit between the bonding wires even though there is a problem of wire sweep. Furthermore, according to the projection portions of the bonding wires of the present invention, the curved direction of one projection portion is different from that of another projection portion so as to increase the pitch between the bonding wires. Thus, there is still no short circuit between the bonding wires even though there is a problem of wire sweep. In addition, according to the projection portions of the bonding wires of the present invention, the curved direction of one projection portion is the same as that of another projection portion, whereby the layout of the projection portion of the straight line in the prior art is redesign to the layout of the projection portion of the curved line in the present invention.

The foregoing, as well as additional objects, features and advantages of the invention will be more apparent from the following detailed description, which proceeds with reference to the accompanying drawings.

BRIEF DESCRIPTION OF THE DRAWINGS

Embodiments of the present invention are illustrated by way of example, and not by limitation, in the figures of the accompanying drawings, wherein elements having the same reference numeral designations represent like elements throughout and wherein.

DETAILED DESCRIPTION OF THE PREFERRED EMBODIMENT

Figure 1:
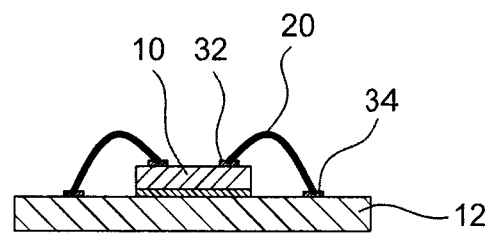
FIG. 1 is a cross-sectional schematic view of a wire bonding structure in the prior art.
Figure 2:
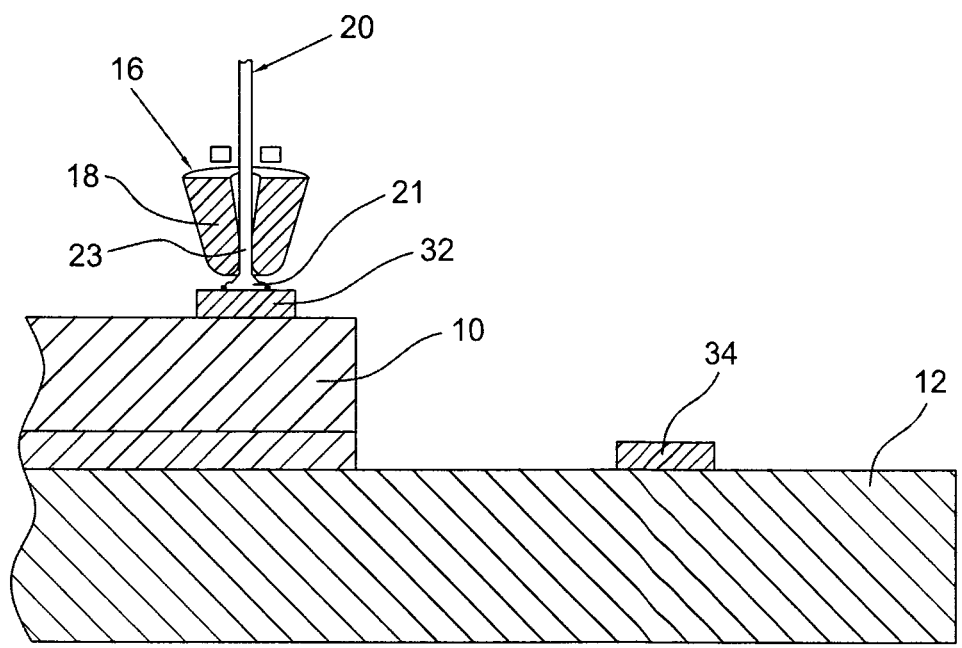
FIGS. 2 to 6 are cross-sectional schematic views showing a forward wire bonding process in the prior art.
Figure 3:
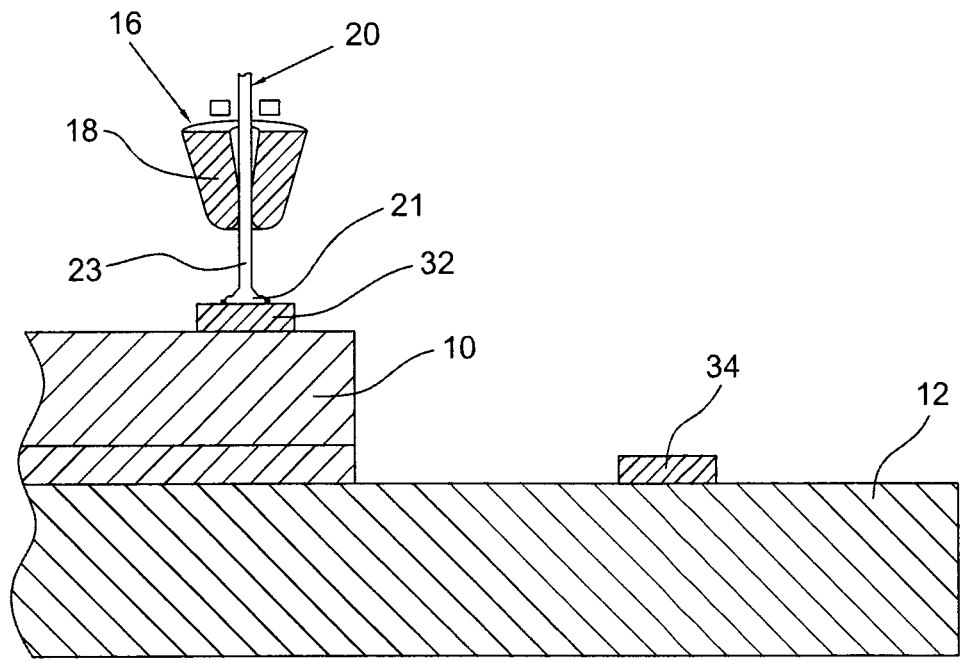
Figure 4:
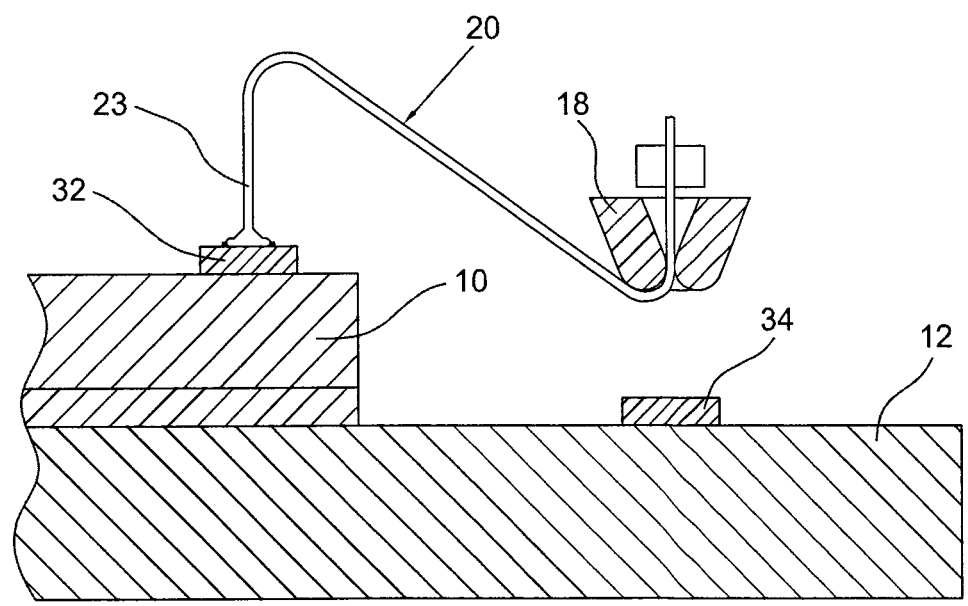
Figure 5:
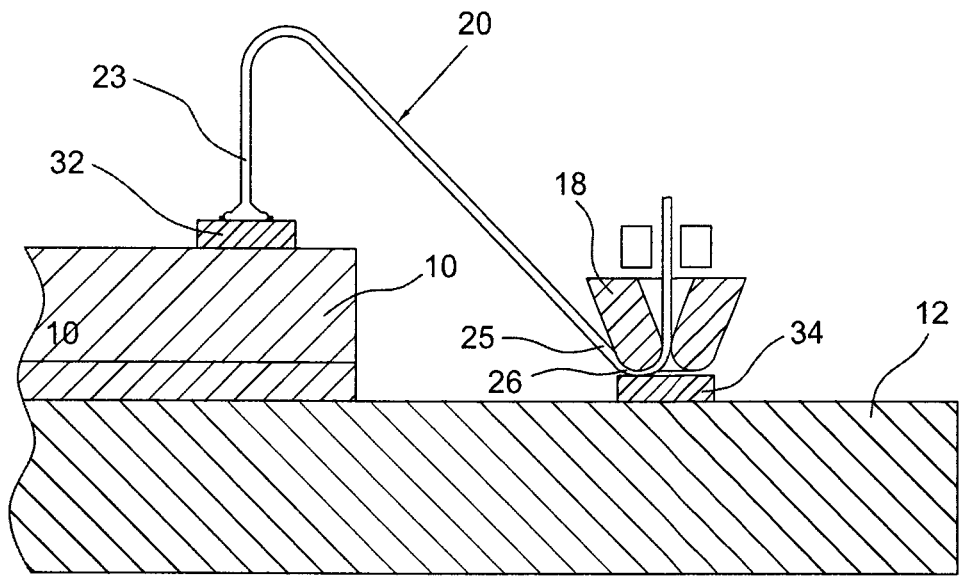
Figure 6:
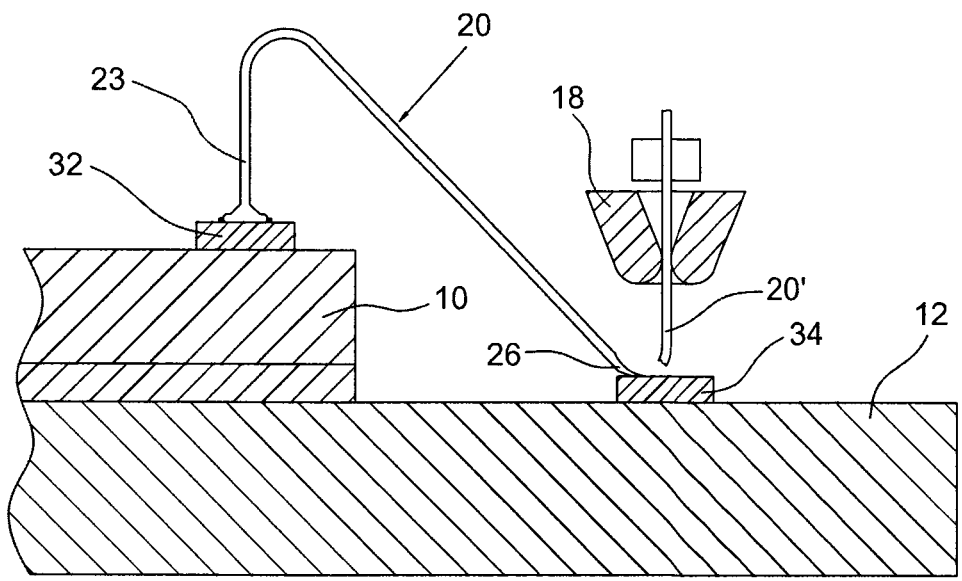
Figure 7:
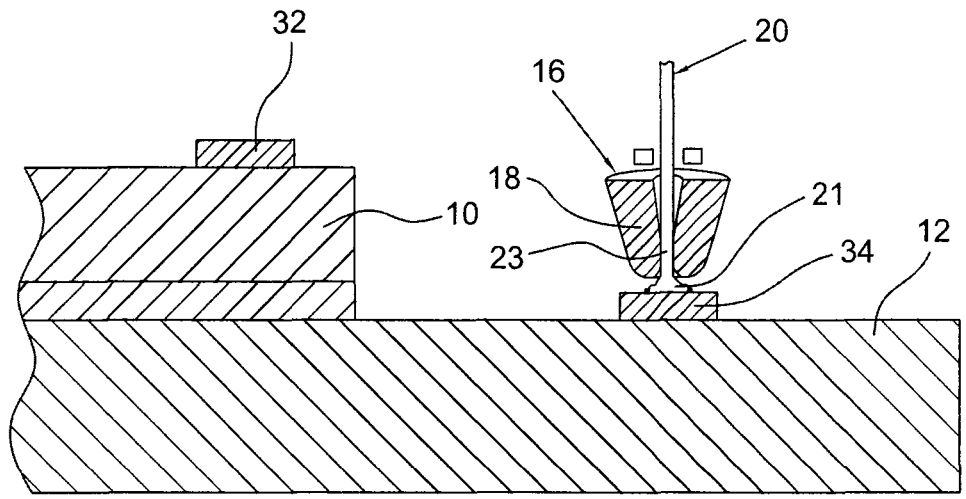
FIGS. 7 to 11 are cross-sectional schematic views showing a reverse wire bonding process in the prior art.
Figure 8:
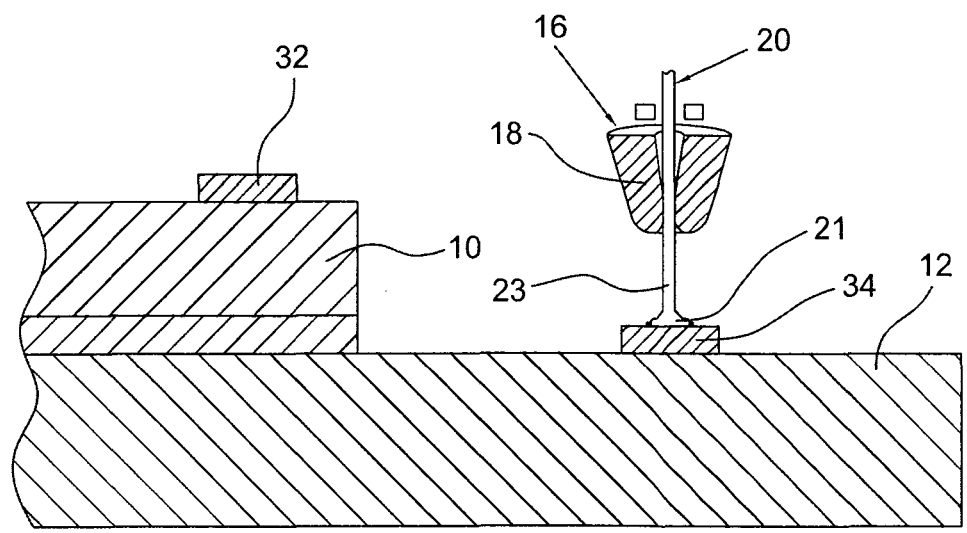
Figure 9:
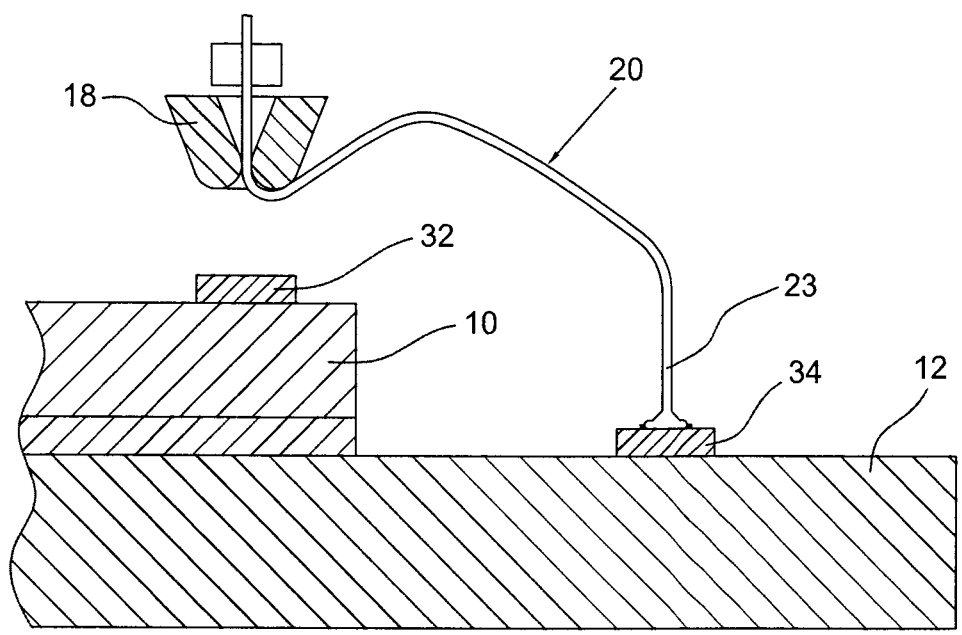
Figure 10:
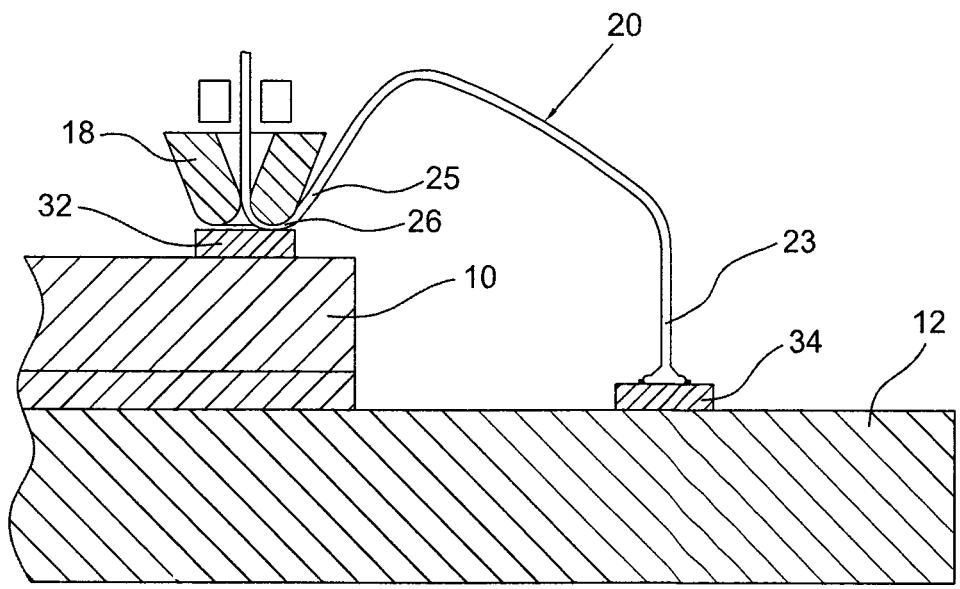
Figure 11:
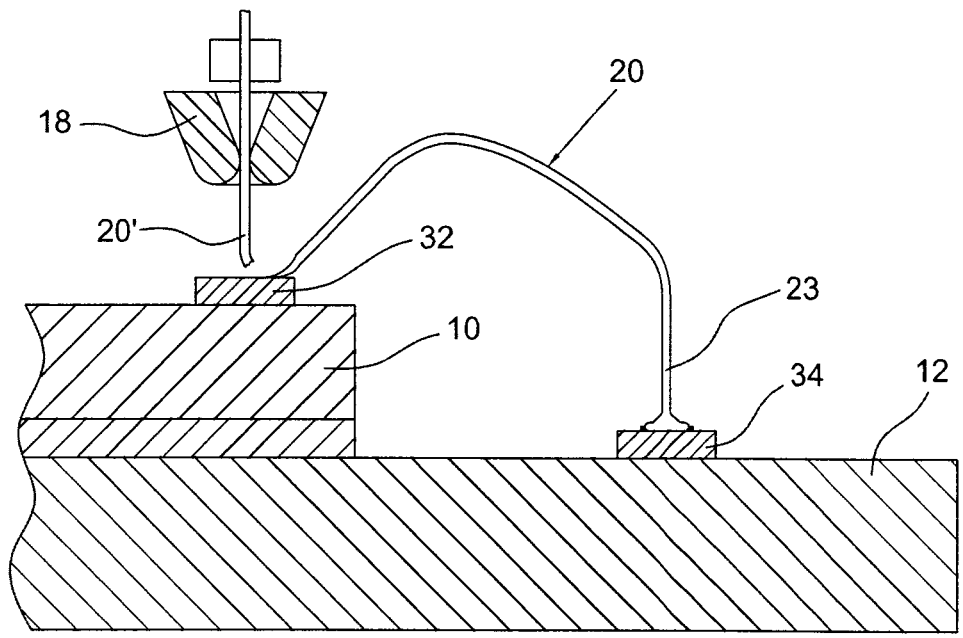
Figure 12:
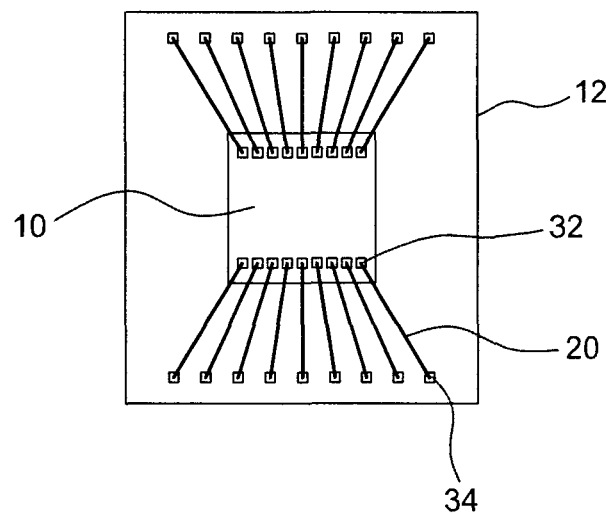
FIG. 12 is a plan schematic view of a wire bonding structure in the prior art.
Figure 13:
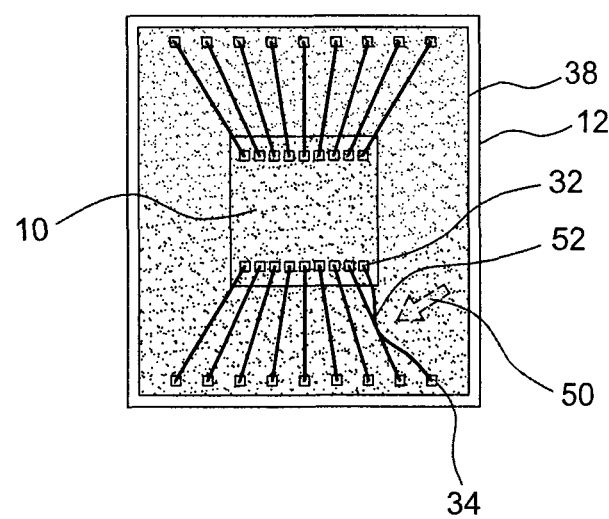
FIG. 13 is a plan schematic view of a wire bonding structure in the prior art, showing that the molding compound is formed.
Figure 14:
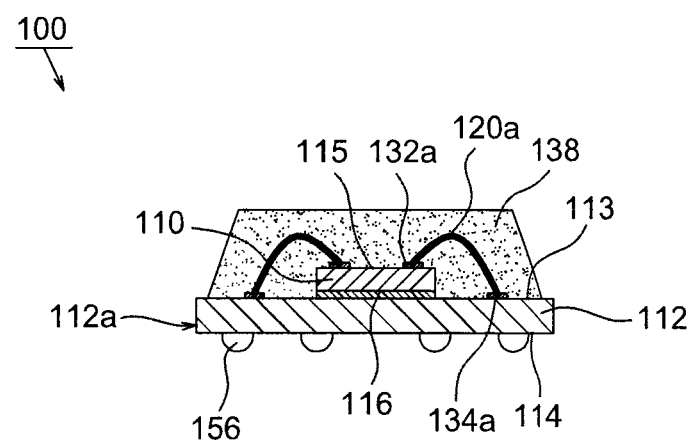
FIG. 14 is a cross-sectional schematic view of a semiconductor package according to an embodiment of the present invention.

Referring to FIG. 14, it depicts a semiconductor package 100 according to an embodiment of the present invention. A semiconductor package 100 includes a chip 110, a carrier 112, a bonding wire 120*a* and a molding compound 138. The chip 110 includes a pad 132*a*. The carrier 112 includes a finger 134*a* and has an upper surface 113 and a lower surface 114 opposite to the upper surface 113. The upper surface 113 supports the chip 110, and the finger 134*a* is located on the upper surface 113. In this embodiment, the chip 110 has an active surface 115 and a back surface 116 opposite to the active surface 115, and the pad 132*a* is located on the active surface 115. The back surface 116 is located on the upper surface 113 of the carrier 112. The molding compound 138 seals the chip 110 and the bonding wire 120*a*, and covers the carrier 112.

Figure 15:
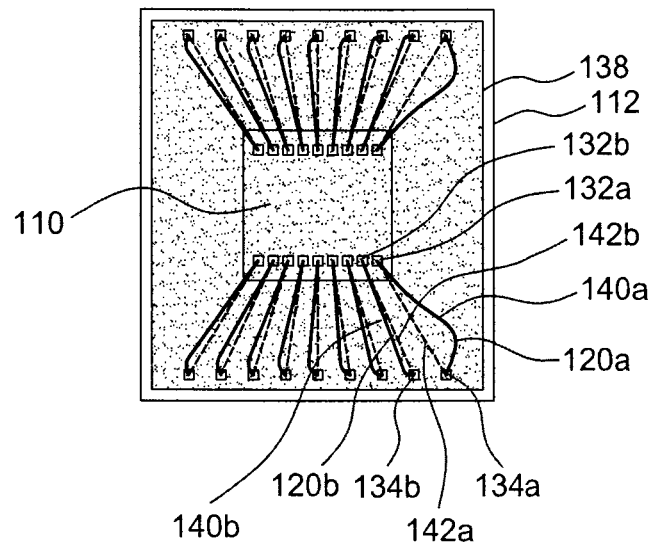
FIG. 15 is a plan schematic view of a semiconductor package according to the embodiment of the present invention.
Figure 16:
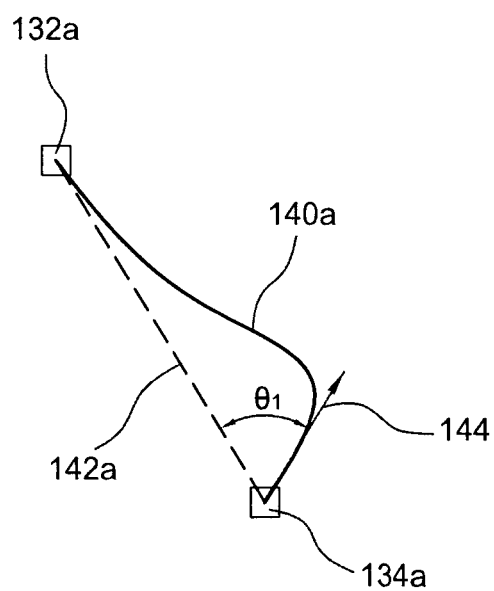
FIG. 16 is an expanded plan schematic view of a bonding wire of the semiconductor package according to the embodiment of the present invention.

Referring to FIG. 15, the bonding wire 120*a* is extended from the finger 134*a* to the pad 132*a* for electrically connecting the chip 110 to the carrier 112. The bonding wire 120*a* defines a projection portion 140*a* on the upper surface 113 of the carrier 112. A straight line 142*a* is defined to pass through the finger 134*a* and pad 132*a*. Referring to FIG. 16, there is a predetermined angle θ1 between a tangent line 144 of the projection portion 140*a* at the finger 134*a* and the straight line 142*a* and. The predetermined angle θ1 is more than 0 degree. Preferably, the predetermined angle θ1 is between about 5 and about 60 degrees. The shape of the projection portion 140*a* is a shape of "J," and the shape of "J" is formed by moving a capillary.

The chip 110 further includes a pad 132*b* adjacent to the pad 132*a*. The carrier 112 further includes a finger 134*b* adjacent to the finger 134*a*. The semiconductor package 100 further includes at least one bonding wire 120*b*, which is extended from the finger 134*b* to the pad 132*b* for electrically connecting the chip 110 to the carrier 112, too. The bonding wire 120*b* also defines a projection portion 140*b* on the upper surface 113 of the carrier 112. A straight line 142*b* is also defined to pass through the finger 134*b* and pad 132*b*. There is also a predetermined angle between the tangent line of the projection portion 140*b* at the finger 134*b* and the straight line 142*b*. The predetermined angle is more than 0 degree. Preferably, the predetermined angle is also between about 5 and about 60 degrees.

In this embodiment, the curved direction of the projection portion 140*a* is different from that of the projection portion 140*b* (e.g., the projection portion 140*a* is bent rightward, and the projection portion 140*b* is bent leftward) so as to increase the pitch between the bonding wires 120*a*, 120*b*. In another embodiment, the curved direction of one projection portion 140*b* is the same as that of another projection portion 140*b* (e.g., all projection portions 140*b* are bent leftward), whereby the layout of the projection portion of the straight line in the prior art is redesign to the layout of the projection portion of the curved line in the present invention.

Referring to FIG. 14 again, in this embodiment, the carrier 112 is a substrate 112*a*. One end of the bonding wire 120*a* is electrically connected to the pad 132*a* of the chip 110, and the other end of the bonding wire 120*a* is electrically connected to the finger 134*a* of the substrate 112*a*. The number of the first and second pads can be a plurality. The pad 132*a* of the chip 110 is electrically connected to the circuit (not shown) of the chip 110. The substrate 112*a* includes external electrical contacts 156 located on the lower surface 114.

Figure 17:
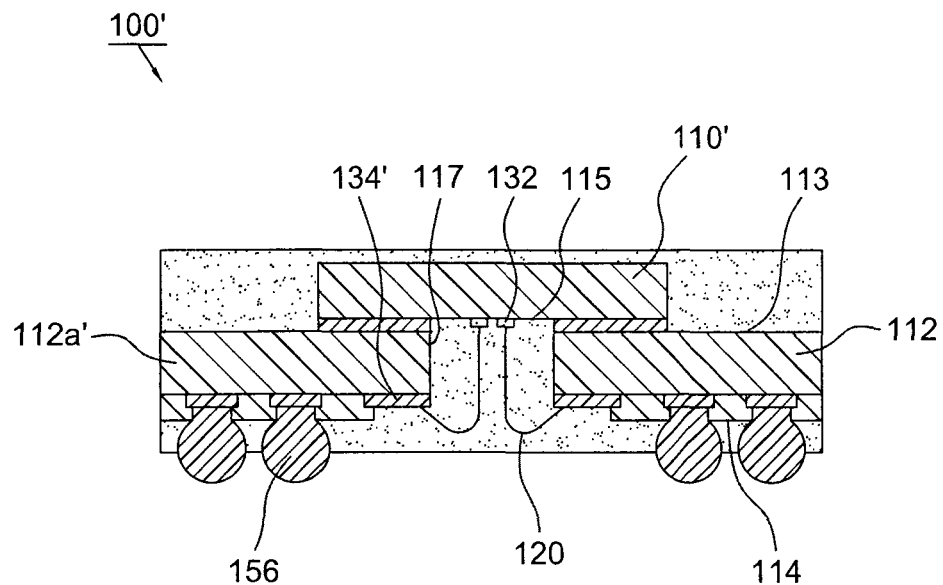
FIG. 17 is a cross-sectional schematic view of a semiconductor package according to another embodiment of the present invention.

Referring to FIG. 17, in another embodiment, the wire bonding structure of the present invention can be applied to a cavity down type package, e.g., W type ball grid array (WBGA) package, i.e., another semiconductor package 100' of the present invention. The semiconductor package 100' is substantially similar to the semiconductor package 100. The difference between the semiconductor packages 100', 100 is that the active surface 115 of the chip 110' is disposed on the upper surface 113 of the carrier 112 (e.g., the substrate 112*a'*). The substrate 112*a'* includes a through hole 117, which is extended from the upper surface 113 to the lower surface 114. The bonding wire 120 passes through the through hole 117, one end of the bonding wire 120 is electrically connected to the pad 132 of the chip 110', and the other end of the bonding wire 120 is electrically connected to the finger 134' of the substrate 112*a'*. The pad 132 of the chip 110 is electrically connected to the circuit (not shown) of the chip 110. The substrate 112*a'* includes external electrical contacts 156 located on the lower surface 114.

Figure 18:
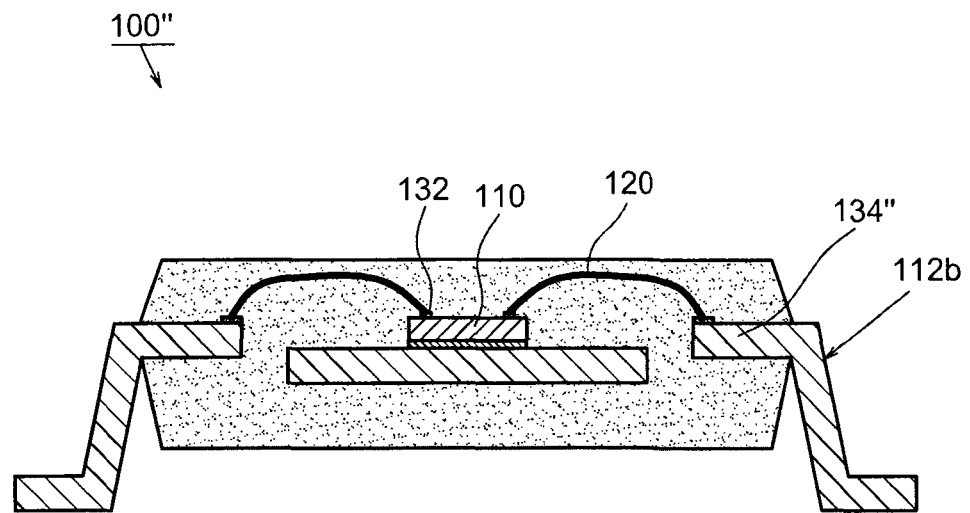
FIG. 18 is a cross-sectional schematic view of a semiconductor package according to a further embodiment of the present invention.

Referring to FIG. 18, in a further embodiment, the wire bonding structure of the present invention can be applied to a package having leadframe, i.e., this package is a further semiconductor package 100" of the present invention. The semiconductor package 100" is substantially similar to the semiconductor package 100. The difference between the semiconductor packages 100", 100 is that the carrier 112 is a leadframe 112*b*. The semiconductor package further includes a pad 134" of a lead and a metallic layer 154, wherein the finger 134 is replaced with the pad 134" of the lead. The pad 134" of the lead is disposed on the leadframe 112*b*. The pad 134" of the lead is electrically connected to the bonding wire 120.

Figure 19:
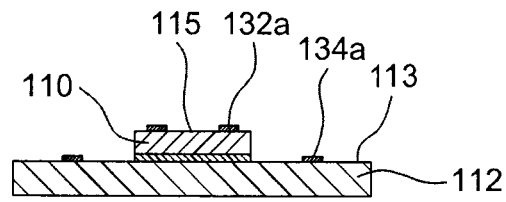
FIGS. 19 to 25 are cross-sectional and plan schematic views showing a method for packaging a semiconductor package according to an embodiment of the present invention.

Referring to FIGS. 19 to 25, they depict a method for packaging a semiconductor package according to an embodiment of the present invention. Referring to FIG. 19, a chip 110 is disposed on a carrier 112, wherein the chip 110 has an active surface 115 and a back surface 116 opposite to the active surface 115, the chip 110 includes a pad 132 (e.g., aluminum pad or copper pad) located on the active surface 115, the carrier 112 has an upper surface 113 and a lower surface 114 opposite to the upper surface 113, the carrier 112 includes a finger 134 (e.g., aluminum finger or copper finger) located on the upper surface 113, and the back surface 116 of the chip 110 is located on the upper surface 113 of the carrier 112.

Figure 20:
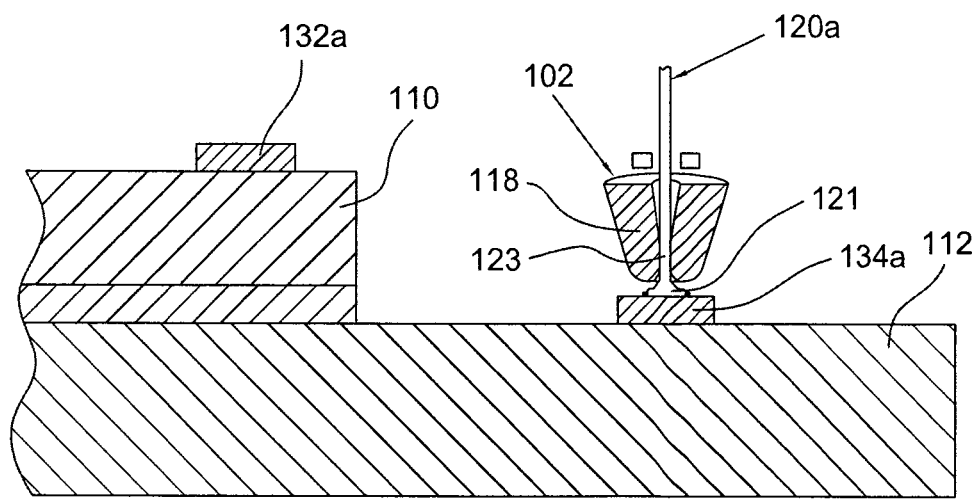
Figure 21:
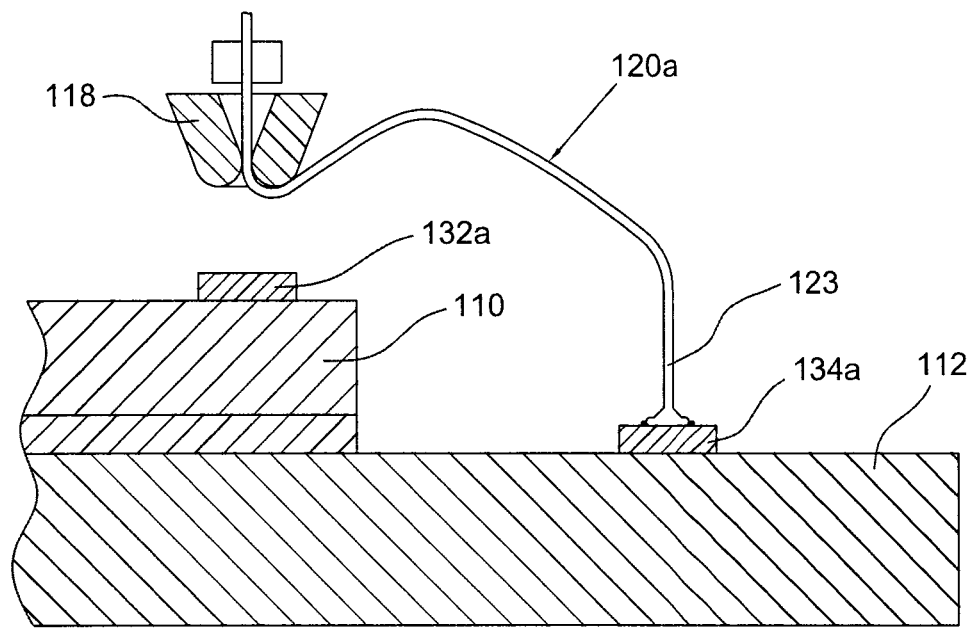
Figure 22:
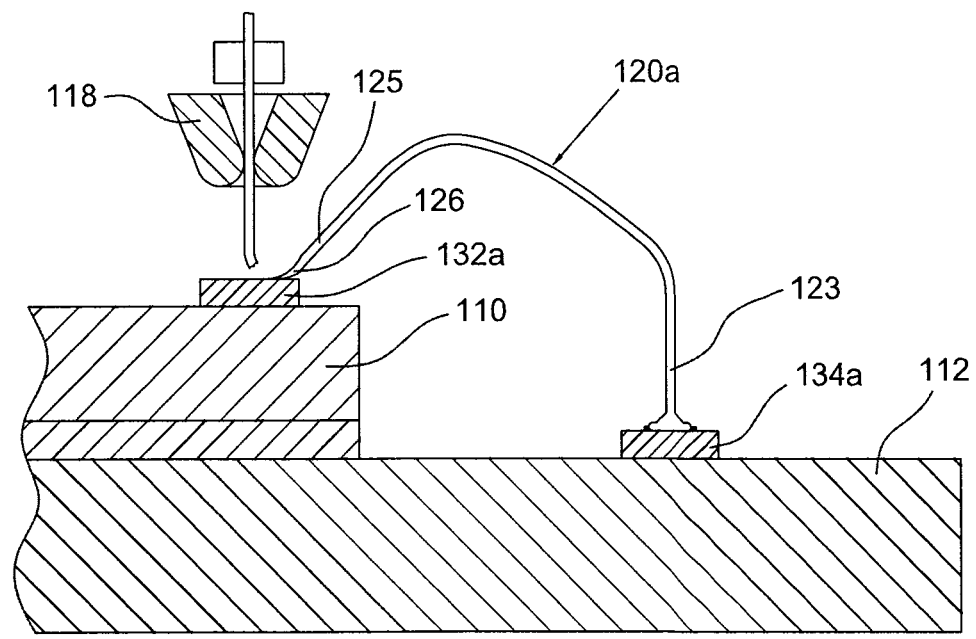

Referring to FIG. 20, a bonding wire 120*a* is provided by a capillary 118 of a wire bonding machine 102. Then, one end 123 of the bonding wire 120*a* is bonded to a finger 134*a*, so as to form a first bond 121. Referring to FIG. 21, the capillary 18 is moved from the finger 134*a* to the pad 132*a*, i.e., the bonding wire 120*a* is curved by the capillary 118, whereby the bonding wire 120*a* is extended from the finger 134*a* to the pad 132*a*. The necessary length of the bonding wire 120*a* is automatically provided by the wire bonding machine 102. The bonding wire 120*a* defines a projection portion 140*a* on the upper surface 113 of the carrier 112. A straight line 142a is defined to pass through the finger 134a and pad 132a. There is a predetermined angle θ1 between a tangent line 144 of the projection portion 140a at the finger 134a and the straight line 142a, shown in FIG. 16. Referring to FIG. 22, the other end 125 of the bonding wire 120a is bonded to a pad 132a so as to form a second bond 126, thereby finishing a reverse wire bonding process of the present invention and forming a wire bonding structure of the present invention. In addition, in order to prevent the pad 132a of the chip 110 from the shock force of the wire bonding process, a spherical portion (not shown) is pre-arranged on the pad 132a and then the other end 125 of the bonding wire 120a is bonded to the spherical portion located on the pad 132a.

Figure 23:
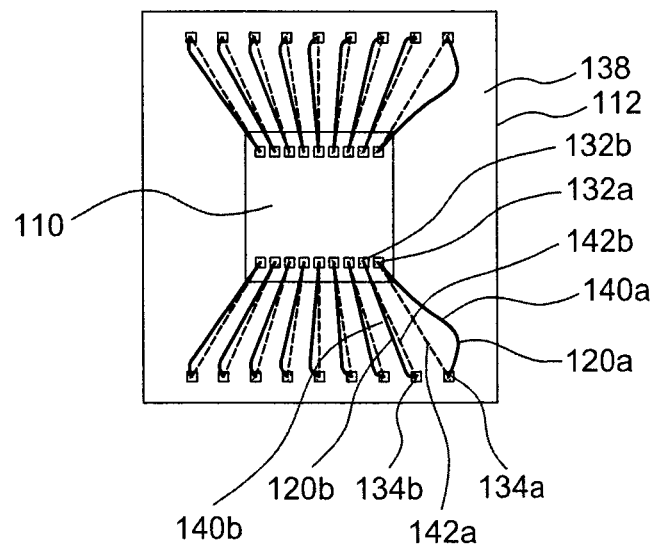

Referring to FIG. 23, a plurality of bonding wires 120b are bonded between the chip 110 and the carrier 112, wherein the bonding wires 120a, 120b are arranged in order, and the bonding wire 120a is located outside the outer one of the bonding wires 120b. The bonding wire 120a is shocked relatively seriously by a mold flow of a molding compound when the molding compound is subsequently formed.

Figure 24:
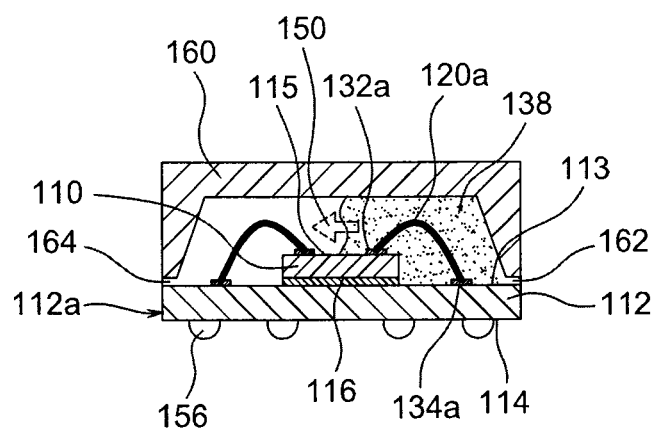

Referring to FIG. 24, a molding compound 138 is formed for sealing the chip 110 and the bonding wires 120a, 120b and covering the carrier 112, whereby the molding compound 138, the chip 110 and the carrier 112 are formed to a semiconductor package 100, shown in FIG. 14. The formation of the molding compound 138 includes the following steps. A mold 160 is provided, wherein the mold 160 has an input hole 162 and an output hole 164. A molding compound 138 is inputted to the mold 160 through the input hole 162 and is outputted from the mold 160 through the output hole 164 so as to form a mold flow 150 of the molding compound 138. The mold 160 is removed, and the molding compound 138 is solidified. In this embodiment, the input hole 162 is located at a side of the mold 160, and thus the molding compound 138 is injected into the mold 160 through the input hole 162 located at the side. In another embodiment, the input hole 162 is located at a top of the mold 160, and thus the molding compound 138 can be also injected into the mold 160 through the input hole 162 located at the top.

Figure 25:
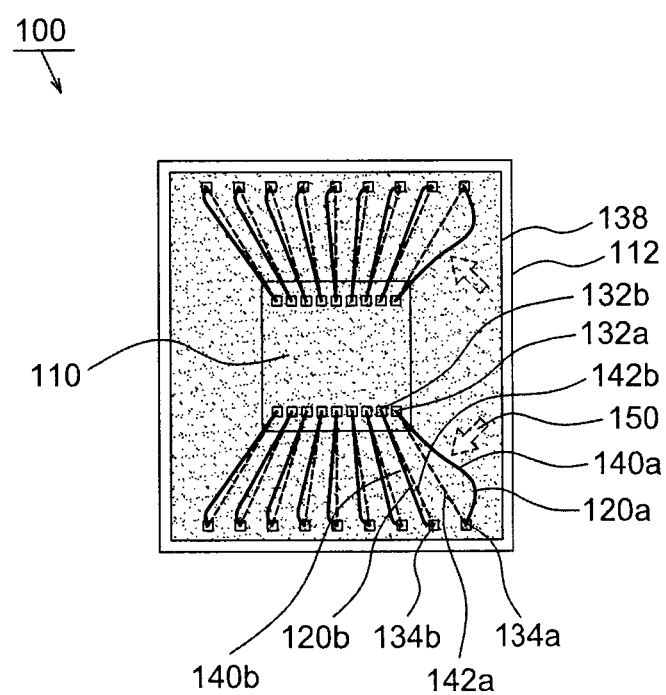

Referring to FIG. 25, since the bonding wire 120a is located outside the outer one of the bonding wires 120b, the bonding wire 120a is shocked relatively seriously by the mold flow 150 of the molding compound 138. According to the projection portion 140a of the bonding wire 120a of the present invention on the upper surface 113 of the carrier 112, the curved direction of the projection portion 140a is opposite to the flow direction of the mold flow 150 of the molding compound 138, thereby providing a safe margin after wire sweep. Thus, there is still no short circuit between the bonding wires 120a, 120b even though there is a problem of wire sweep. Furthermore, according to the projection portions of the bonding wires 120a, 120b of the present invention, the curved direction of the projection portion 140a is different from that of the projection portion 140b so as to increase the pitch between the bonding wires 120a, 120b. Thus, there is still no short circuit between the bonding wires 120a, 120b even though there is a problem of wire sweep. In addition, according to the projection portions of the bonding wires 120b of the present invention, the curved direction of one projection portion 140b is the same as that of another projection portion 140b, whereby the layout of the projection portion of the straight line in the prior art is redesign to the layout of the projection portion of the curved line in the present invention.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A semiconductor package, comprising:
   a chip having a first pad and a second pad adjacent to the first pad;
   a carrier having a first finger, a second finger adjacent to the first finger, an upper surface and a lower surface opposite to the upper surface, wherein the upper surface supports the chip;
   a first bonding wire extended from the first finger to the first pad and electrically connecting the chip to the carrier, wherein the first bonding wire defines a first projection portion on the upper surface of the carrier and the first projection portion defines a curved line on the upper surface of the carrier, a first straight line is defined to pass through the first finger and the first pad, a first predetermined angle from about 5 degrees to about 60 degrees is defined between a tangent line of the first projection portion at the first finger and the first straight line;
   a second bonding wire extended from the second finger to the second pad and electrically connecting the chip to the carrier, wherein the second bonding wire defines a second projection portion on the upper surface of the carrier and the second projection portion defines a curved line on the upper surface of the carrier, a second straight line is defined to pass through the second finger and the second pad, wherein the first and second projection portions are curved in different directions; and
   a molding compound sealing the chip and the first and second bonding wires and covering the carrier.

2. The semiconductor package as claimed in claim 1, wherein the first bonding wire comprises a first end and a second end, the first end is bonded to the first finger at a first bond, and the second end is bonded to the first pad at a second bond.

3. The semiconductor package as claimed in claim 1, wherein a second predetermined angle from about 5 degrees to about 60 degrees is defined between a tangent line of the second projection portion at the second finger and the second straight line.

4. The semiconductor package as claimed in claim 1, wherein the shape of the first projection portion is a shape of "J".

5. The semiconductor package as claimed in claim 4, wherein the shape of "J" is formed by moving a capillary.

6. The semiconductor package as claimed in claim 1, wherein the chip has an active surface and a back surface opposite to the active surface, and the first pad is located on the active surface.

7. The semiconductor package as claimed in claim 6, wherein the carrier is a substrate.

8. The semiconductor package as claimed in claim 7, wherein the back surface of the chip is located on the upper surface of the carrier, and the first finger is located on the upper surface of the carrier.

9. The semiconductor package as claimed in claim 7, wherein the active surface of the chip is located on the upper surface of the carrier, and the first finger is located on the lower surface of the carrier.

10. The semiconductor package as claimed in claim 1, wherein the carrier is a leadframe, and the first finger is a pad of a lead of the leadframe.

11. A method of packaging a semiconductor package, the method comprising:
- disposing a chip on a carrier, wherein the chip has a first pad, a second pad adjacent to the first pad, the carrier has a first finger, a second finger adjacent to the first finger, an upper surface and a lower surface opposite to the upper surface, and the upper surface supports the chip;
- providing a first bonding wire and a second bonding wire by a capillary, wherein each of the first and second bonding wires has a first end and a second end;
- bonding the first end of the first bonding wire to the first finger at a first bond;
- moving the capillary from the first finger to the first pad, whereby the first bonding wire is extended from the first finger to the first pad, wherein the first bonding wire defines a first projection portion on the upper surface of the carrier and the first projection portion defines a curved line on the upper surface of the carrier, a first straight line is defined to pass through the first finger and the first pad, a predetermined angle from about 5 degrees to about 60 degrees is defined between the tangent line of the first projection portion at the first finger and the first straight line;
- bonding the second end of the first bonding wire to the first pad at a second bond;
- bonding the first end of the second bonding wire to the second finger at a third bond;
- moving the capillary from the second finger to the second pad, whereby the second bonding wire is extended from the second finger to the second pad, wherein the second bonding wire defines a second projection portion on the upper surface of the carrier and the second projection portion defines a curved line on the upper surface of the carrier, a second straight line is defined to pass through the second finger and the second pad;
- bonding the second end of the second bonding wire to the second pad at a fourth bond;
- providing a mold, wherein the mold has an input hole and an output hole;
- inputting a molding compound to the mold through the input hole, and outputting the molding compound from the mold through the output hole so as to form a mold flow of the molding compound, wherein the first projection portion is curved to face the mold flow, and the first and second projection portions are curved in different directions; and
- removing the mold and solidifying the molding compound, wherein the molding compound seals the chip and the first and second bonding wires, and covering the carrier, whereby the molding compound, the chip and the carrier are formed into a semiconductor package.

12. The method as claimed in claim 11, wherein before the formation of the molding compound, the method further comprises:
- bonding a plurality of third bonding wires between the chip and the carrier, wherein the first, second and third bonding wires are arranged in order, and the first bonding wire is located outside the outermost one of the second and third bonding wires.

13. The method as claimed in claim 11, wherein the shape of the projection portion is a shape of "J".

14. The method as claimed in claim 11, wherein the chip has an active surface and a back surface opposite to the active surface, and the first pad is located on the active surface.

15. The method as claimed in claim 14, wherein the back surface of the chip is located on the upper surface of the carrier, and the first finger is located on the upper surface of the carrier.

* * * * *